(12) United States Patent
Goeke et al.

(10) Patent No.: US 8,717,053 B2
(45) Date of Patent: May 6, 2014

(54) DC-AC PROBE CARD TOPOLOGY

(75) Inventors: Wayne C. Goeke, Hudson, OH (US); William Knauer, Chagrin Falls, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 208 days.

(21) Appl. No.: 13/289,382

(22) Filed: Nov. 4, 2011

(65) Prior Publication Data

US 2013/0113511 A1    May 9, 2013

(51) Int. Cl.
| | |
|---|---|
| G01R 31/00 | (2006.01) |
| G01R 31/02 | (2006.01) |
| G01R 1/067 | (2006.01) |
| G01R 1/073 | (2006.01) |
| G01R 1/18 | (2006.01) |
| G01R 1/00 | (2006.01) |
| G01R 31/319 | (2006.01) |
| G01R 3/00 | (2006.01) |

(52) U.S. Cl.
CPC ............ G01R 1/06766 (2013.01); G01R 1/073 (2013.01); G01R 1/18 (2013.01); G01R 1/00 (2013.01); G01R 31/31926 (2013.01); G01R 3/00 (2013.01)

USPC ................. 324/755.01; 324/750.01; 324/72.5

(58) Field of Classification Search
CPC ...... G01R 1/06766; G01R 1/073; G01R 1/18; G01R 1/00; G01R 31/31926; G01R 3/00
USPC ........................................ 324/750.01–755.01
See application file for complete search history.

(56) References Cited

U.S. PATENT DOCUMENTS

| | | | |
|---|---|---|---|
| 7,659,742 B1 * | 2/2010 | Jacobson et al. | 324/750.02 |
| 7,855,544 B1 * | 12/2010 | Knauer | 324/72.5 |
| 2002/0084795 A1 * | 7/2002 | Cook et al. | 324/754 |
| 2004/0100248 A1 * | 5/2004 | Mende | 324/117 H |
| 2010/0045331 A1 * | 2/2010 | Bundhoo et al. | 324/765 |

* cited by examiner

*Primary Examiner* — Jermele M Hollington
*Assistant Examiner* — Farhana Hoque
(74) *Attorney, Agent, or Firm* — Pearne & Gordon LLP

(57) ABSTRACT

A DC-AC probe card for testing a DUT includes: a plurality of probe needles, each probe needle having a distal end for contacting said DUT; and a plurality of connection pathways operable to connect test instrumentation to the probe needles, wherein each connection pathway provides both a desired characteristic impedance for AC measurements and a guarded pathway for DC measurements between respective test instrument connections and probe needles.

5 Claims, 5 Drawing Sheets

DC-AC PROBE CARD TOPOLOGY

BACKGROUND OF THE INVENTION

The present invention relates to electrical measurements and, in particular, to probe cards.

In testing small electrical devices (e.g., integrated circuits and circuit boards), it is common to use probe cards that provide an interface between test instruments and the device under test (DUT). The probe card provides the connections between probe needles and the test instruments/cables. In turn, the probe needles make electrical connections with the DUT during testing. By substituting probe cards with differing probe layouts, it is possible to change where on a DUT tests are made. A common configuration for probe cards is have the probe needles arranged radially about the DUT with connection pathways radiating outward from the probe needles. The opposite ends of the connection pathways then provide connection points for the test instruments/cables. Typically, the connection pathways are either integral with or mounted on a supporting structure along with the probe needles (e.g., a printed circuit board).

Besides the touch down locations of the needles, it is often important to consider the nature of the required connections to the DUT. For example, in the case of very low current DC measurements, minimizing extraneous leakage current is often important, while in AC measurements, losses and reflections due to impedance mismatches are often important.

These considerations often result in having to change probe cards depending on the type of measurement to be made, even if the probe needles themselves are in the correct location, the connection pathways between the instrument connections and the probe needles may not be suitable for the measurement.

Referring to FIG. 14, a probe card 1 suitable for low current testing connects the source measure unit 2 (SMU 2) to the probe needle 3 and the SMU 4 to the probe needle 5. A SMU can source a voltage/current and measure a current/voltage, respectively. The probe needles 3, 5 provide test connections to the DUT. As is typical in low current DC measurements, guard conductors 6, 7 containing a "guard" voltage are provided next to the signal conductors 8, 9, respectively. The guard voltage is typically supplied by the respective SMU 2, 4. This voltage is a buffered version of the signal on the respective signal conductor. Because the guard voltage and the signal voltage are equal, the signal conductors 8, 9 do not "see" any potential difference to cause leakage from the signal conductors 8, 9. It is said that this "guards" the signal conductors from leakage. Therefore, the guard conductors 6, 7 are often simply called guards. They are often coaxial with the signal conductors, but other configurations are also used, for example, such as being a planar conductor near to the signal conductor while having a width substantially greater than that of the signal conductor or other strip line configurations suitable for printed circuit board implementation. The ground connection 10 between the SMUs 2, 4 is shown off the probe card 1, but may also be on the probe card 1.

Referring to FIG. 15, the probe card 1 can be used to connect AC test instrumentation 11, 12 to the DUT. However, this configuration will often not be satisfactory for AC measurements as the guard conductors 6, 7 are "floating" at the AC voltage. From a transmission line perspective, the guard conductors 6, 7 are transmission line stubs as they near the DUT. The return path for the AC signals is through the ground connection 10, not through the ends of the guard conductors 6, 7. The configuration is unlikely to exhibit the measurement systems' characteristic impedance, instead causing losses and reflections of the AC signal. If the AC signal is such that this transmission line effect is significant (e.g., radio frequencies), then a different probe card configuration will be needed for AC measurements.

SUMMARY OF THE INVENTION

A DC-AC probe card for testing a DUT includes: a plurality of probe needles, each probe needle having a distal end for contacting said DUT; and a plurality of connection pathways operable to connect test instrumentation to the probe needles, wherein each connection pathway provides both a desired characteristic impedance for AC measurements and a guarded pathway for DC measurements between respective test instrument connections and probe needles.

DESCRIPTION OF THE PREFERRED EMBODIMENTS

Figure 1:
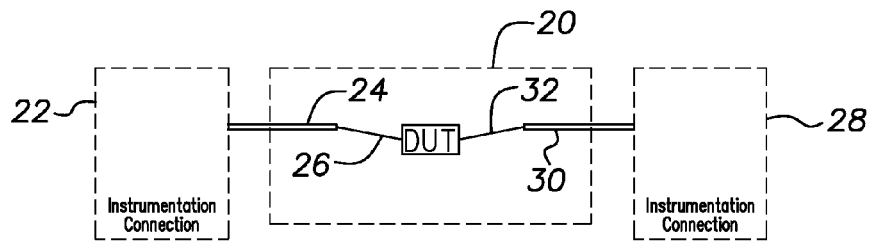
FIG. 1 is schematic diagram of an example of a DC-AC probe card according to an aspect of the invention.

Referring to FIG. 1, a DC-AC probe card 20 connects an instrumentation connection 22 to a connection pathway 24. The connection pathway 24 connects in turn to a probe needle 26, which during operation of the probe card 20 connects to a device under test (DUT).

Similarly, an instrumentation connection 28 connects to a connection pathway 30. The connection pathway 30 connects in turn to a probe needle 32 which during operation of the probe card 20 connects to the DUT.

The DUT is not part of the probe card 20 but will typically be located where the probe needles can touch down on the DUT to make connections thereto. This is the case for all of the examples set forth herein.

Further, when reference is made to proximal and distal herein, proximal is electrically towards test instrumentation and distal is electrically towards the DUT. For example, the distal end of a probe needle is used to make contact with the DUT.

For ease of understanding, the examples herein only employ two connections to the DUT, actual probe cards will typically be capable of many more connections.

The term "instrumentation connection" as used herein encompasses both some form of AC or DC test instrumentation and associated cabling between the test instrumentation and the probe card. It is expected that the probe cards described herein will typically include electrical connectors between the probe card and the instrumentation connection. These provide convenient connection/disconnection of the probe card from the instrumentation connections. For ease of understanding, these electrical connectors are not shown. The frequency of the AC signals herein may be, for example, between 1 KHz and 1 GHz.

In the case of DC measurements, the connection pathways 24, 30 each provide a guarded pathway between the respective instrumentation connections 22, 28 and the respective probe needles 26, 32. In the case of AC measurements, the same connection pathways 24, 30 provide a connection having a desired characteristic impedance (e.g., 50 or 75 ohms).

Figure 2:
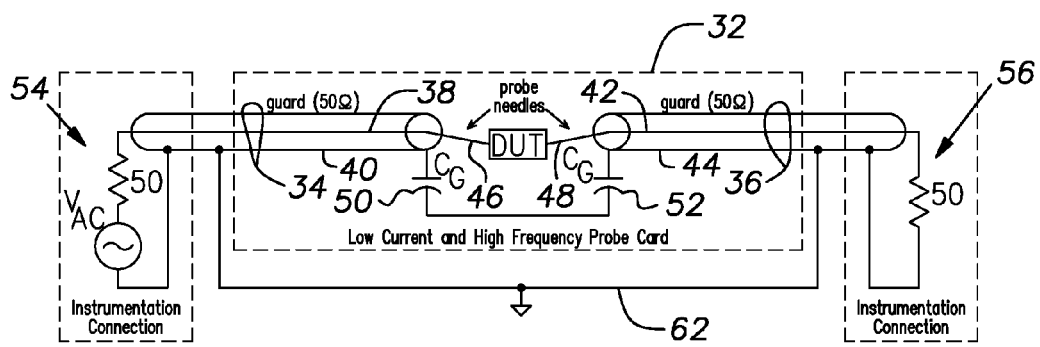
FIG. 2 is a schematic diagram of an example of a DC-AC probe card according to another aspect of the invention in an AC configuration.

Referring to FIG. 2, a DC-AC probe card 32 includes a first conductor pair 34 and a second conductor pair 36. The first conductor pair 34 includes a first conductor 38 and a second conductor 40. The second conductor pair 36 includes a third conductor 42 and a fourth conductor 44. A first probe needle 46 and a second probe needle 48 are located in positions suitable for contacting a DUT.

The distal end of the first conductor 38 is connected to the first probe needle 46. The distal end of the third conductor 42 is connected to the probe needle 48.

The distal ends of the second and fourth conductors are connected to the commonly connected capacitors 50, 52. In this example, the commonly connected capacitors 50, 52 constitute a coupling circuit as more fully described below.

In operation, the proximal ends of the first conductor 38 and the second conductor 40 are connected to AC test instrumentation 54 and the proximal ends of the third conductor 42 and the second conductor 44 are connected to the AC test instrumentation 56. In this example, for ease of understanding, the AC test instrumentation 54 is an AC voltage source with a 50 ohm impedance and the AC test instrumentation 56 is 50 ohm load. In general, the AC test instrumentation may be, for example, signal generators, pulse generators, oscilloscopes, AC voltage and current meters, or AC power meters. It is expected that the AC test instrumentation will have a characteristic impedance (e.g., 50 ohms). As a result, it is desirable that the probe card 32 also have the same characteristic impedance. Having this same desired characteristic impedance minimizes losses and detrimental reflections in the overall measurement system.

The conductor pairs 34, 36 are each shown as coaxial cables. Such cables are available with various characteristic impedances, 50 ohm and 75 ohm being common. It is also common to use strip line structures on printed circuit boards to provide a conductor pair with a desired characteristic impedance.

The coupling circuit comprised of the commonly connected capacitors 50, 52 is used to provide the desired characteristic impedance up to as close to the probe needles 46, 48 as possible. For example, the capacitors 50, 52 each have a capacitance that will pass AC signals being used for testing between the distal ends of the conductors 40, 44. Absent this coupling, the distal ends of the conductors 40, 44 would be floating transmission line stubs of uncertain impedance likely to cause losses and reflections that degrade measurements of the DUT.

Figure 3:
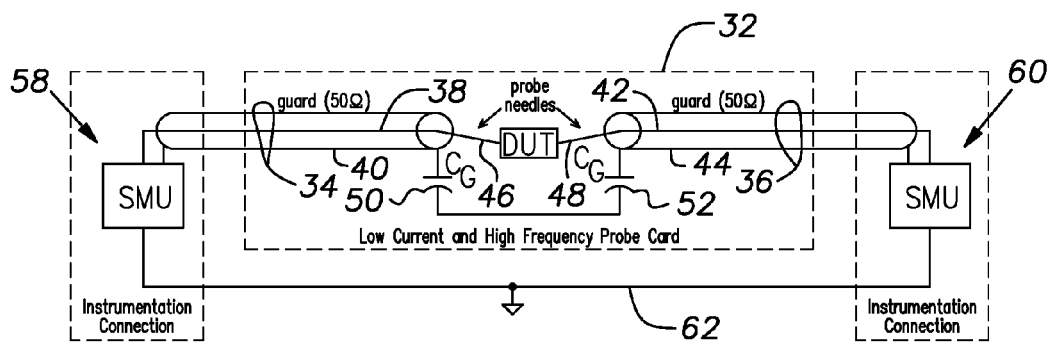
FIG. 3 is a schematic diagram of the DC-AC probe card of FIG. 2 in a DC configuration.

Referring to FIG. 3, the DC-AC probe card 32 is shown instead connected to DC test instrumentation. The proximal end of the conductor pair 34 is connected to DC test instrumentation 58 and the proximal end of the conductor pair 36 is connected to the DC test instrumentation 60.

In this example, the DC test instrumentation 58, 60 are each a SMU. A SMU can source a DC voltage/current and measure a DC current/voltage, respectively. SMU are often used to measure low currents (e.g., microamperes, femtoamperes). At low currents, leakage current unrelated to the DUT may be particularly detrimental. SMUs provide guard voltages to help minimize leakage currents. The guard voltage is a buffered version of the actual signal voltage.

The guard voltage of the SMU 58 is connected to the proximal end of the second conductor 40. The actual signal of the SMU 58 is connected to the proximal end of the first conductor 38.

Similarly, the guard voltage of the SMU 60 is connected to the proximal end of the fourth conductor 44. The actual signal of the SMU 60 is connected to the proximal end of the third conductor 42.

In this configuration, the voltage on the second conductor 40 guards the first conductor 38 and the voltage on the fourth conductor 44 guards the third conductor 42.

Because the signals are DC, the coupling circuit comprised of the commonly connected capacitors 50, 52 now decouples the distal ends of the conductors 40, 44 instead of coupling them as in FIG. 2.

In the case of AC test instrumentation, the coupling circuit couples the distal ends of the second conductor 40 and the fourth conductor 44. In the case of DC test instrumentation, the coupling circuit decouples the distal ends of the conductors 40, 44.

The capacitors 50, 52 allow the conductors 40, 44 to carry AC ground current for higher frequencies where the capacitors 50, 52 are able to effectively short the distal ends together. Frequencies that are lower than where the guards are effectively shorted together must return their ground current though the actual ground path 62. Increasing the capacitance of the capacitors 50, 52 will lower the frequency at which the guards are effectively shorted together. However, increasing these capacitances makes it harder for the SMUs to drive the guards during DC testing.

The loop area of the ground pathway also affects how wide of a frequency band for which the pathway will not effectively function. Decreasing the loop area of the ground pathway reduces the inductance of the loop area. The ground current can then flow through the ground path for lower frequencies without further increasing the capacitance of the capacitors 50, 52.

Figure 4:
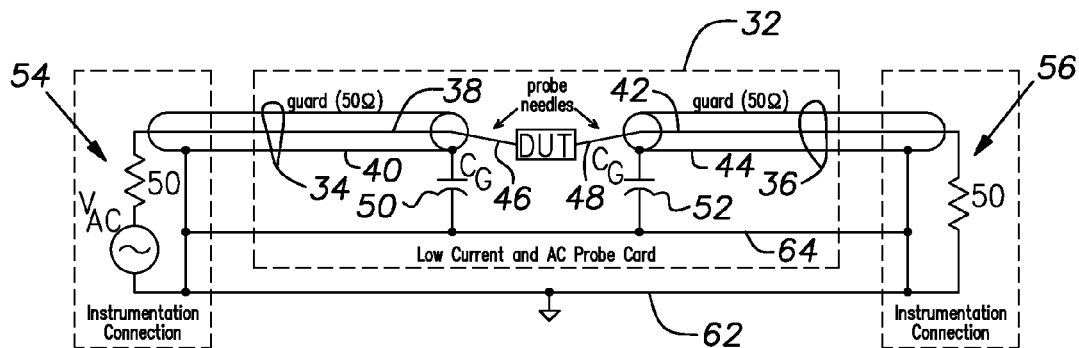
FIG. 4 is a schematic diagram of an example of a DC-AC probe card according to still another aspect of the invention.

Referring to FIG. 4, a DC-AC probe card 32' similar to the previous example of FIG. 2 adds another parallel ground path 64 that is on the DC-AC probe card 32'. The ground path 64, being closer than the ground path 62 to the conductors 40, 44, results in a lower inductance. This lower impedance further lowers the frequency at which the conductors 40, 44 are effectively shorted together (or, if desired, the values of the capacitors 50, 52 may be also lowered to maintain the same frequency performance).

Figure 5:
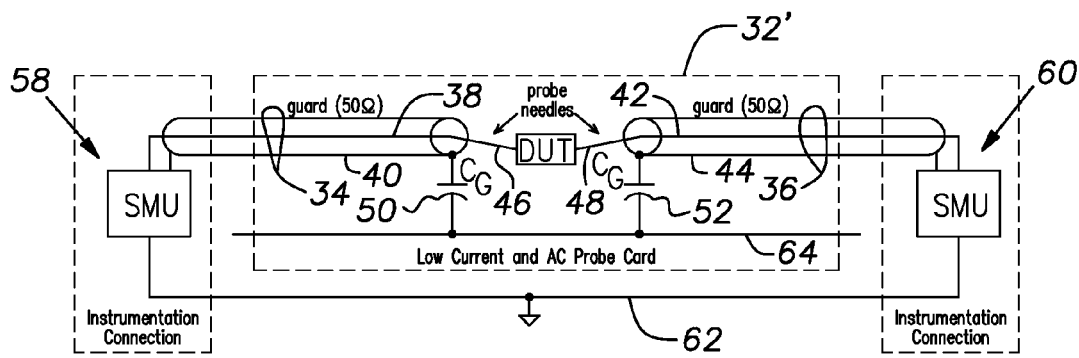
FIG. 5 is a schematic diagram of the DC-AC probe card of FIG. 4 in a DC configuration

Referring to FIG. 5, the DC-AC probe card 32' is shown in a DC measurement configuration similar to FIG. 3.

Figure 6:
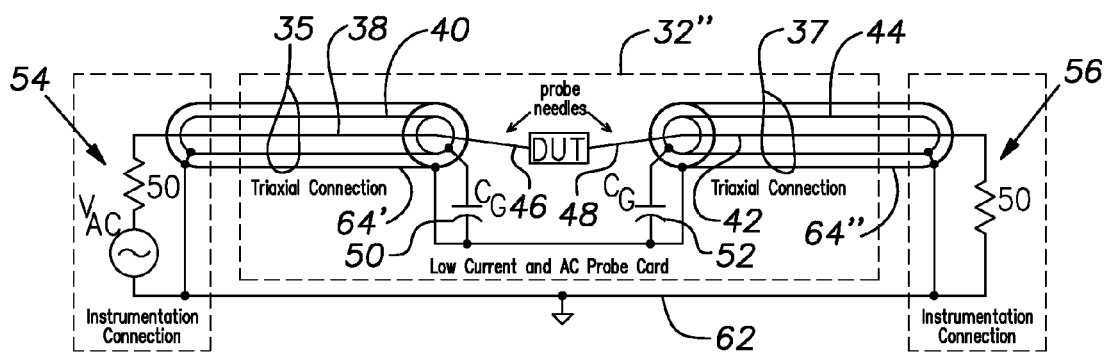
FIG. 6 is a schematic diagram of an example of a DC-AC probe card according to an additional aspect of the invention.

Referring to FIG. 6, the DC-AC probe card 32" makes use of triaxial structures 35, 37 to further control the inductance.

The outer shield conductors 64', 64" now provide the ground path 64 of FIG. 4. The loop area and thus the inductance is further reduced. This further lowers the frequency at which the conductors 40, 44 are shorted together.

Figure 7:
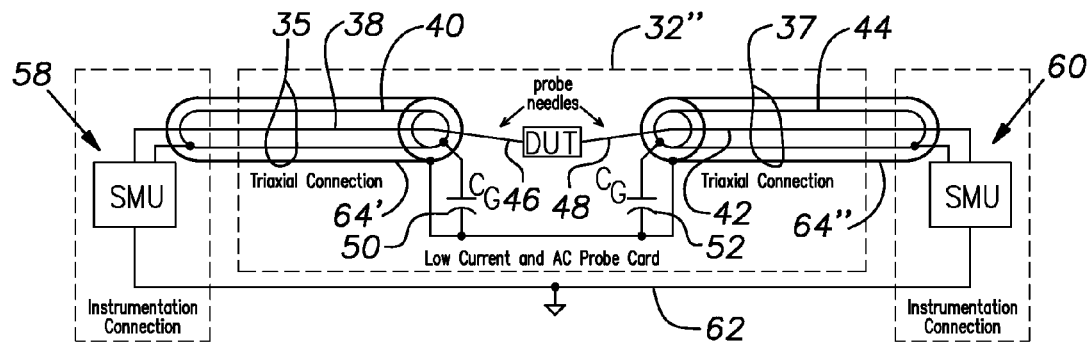
FIG. 7 is a schematic diagram of the DC-AC probe card of FIG. 6 in a DC configuration

Referring to FIG. 7, the DC-AC probe card 32" is shown in a DC measurement configuration similar to FIG. 5.

Figure 8:
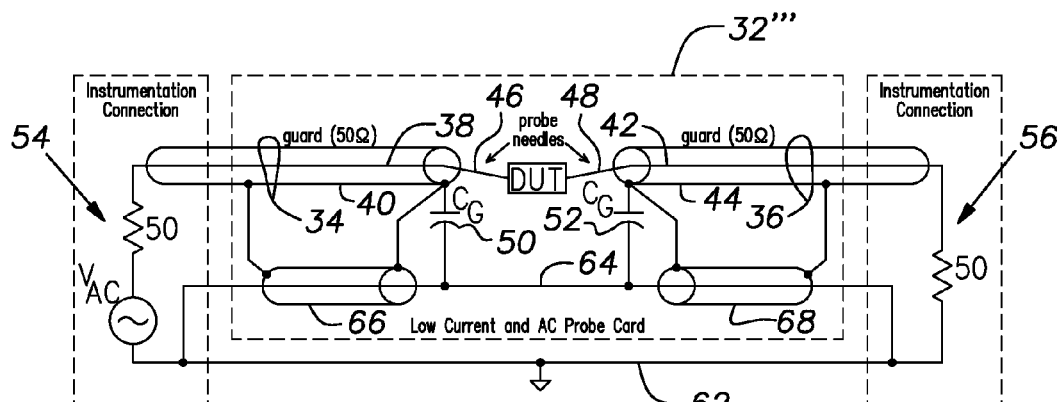
FIG. 8 is a schematic diagram of an example of a DC-AC probe card according to another additional aspect of the invention.

Referring to FIG. 8, the DC-AC probe card 32''' is similar to the example of FIG. 6 except instead of a triaxial structure, coaxial conductors 66, 68 are arranged around respective portions of the ground path 64. The proximal and distal ends of the coaxial conductors 66, 68 are connected to respective portions of the conductors 40, 44. This couples the upper and lower coaxial structures together.

Figure 9:
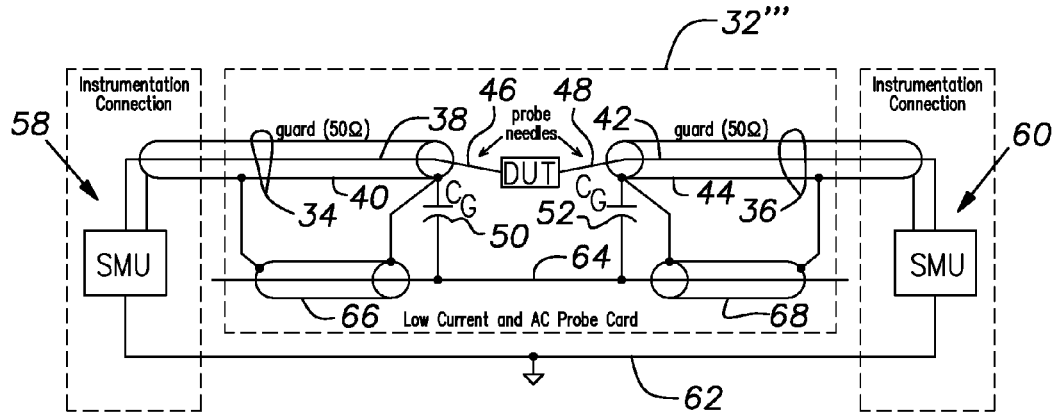
FIG. 9 is a schematic diagram of the DC-AC probe card of FIG. 8 in a DC configuration.

Referring to FIG. 9, the DC-AC probe card 32''' is shown in a DC measurement configuration similar to FIG. 5.

It should be noted that presence of capacitance and inductance will lead to possible issues with resonance frequencies. This can be managed by the addition of resistance to the loops.

Figure 10:
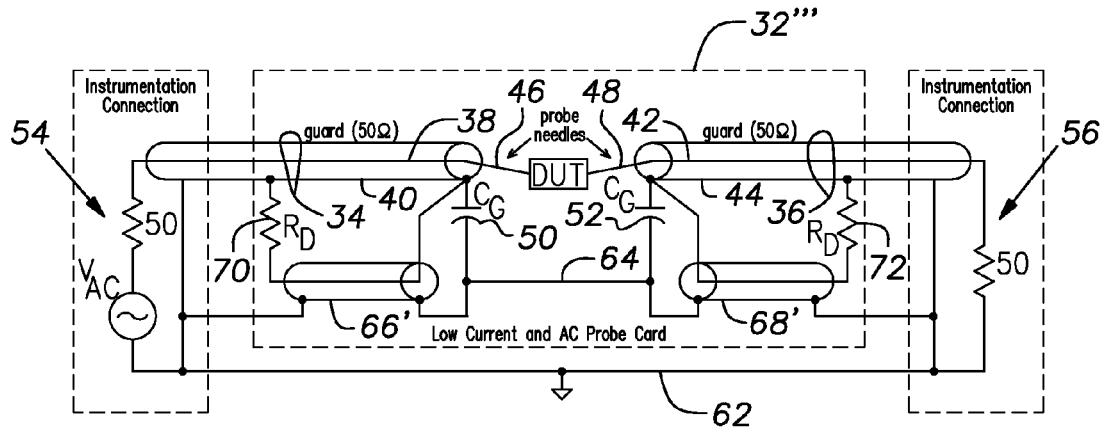
FIG. 10 is a schematic diagram of an example of a DC-AC probe card according to still another additional aspect of the invention.

Referring to FIG. 10, the DC-AC probe card 32'''' is similar to the example of FIG. 8 with the resistors 70, 72 substituted for direct connections and the coaxial conductors 66', 68' having the shield and center connections interchanged from the coaxial conductors 66, 68. This reduces the Q of the resonance of the pathway inductance and capacitance.

Figure 11:
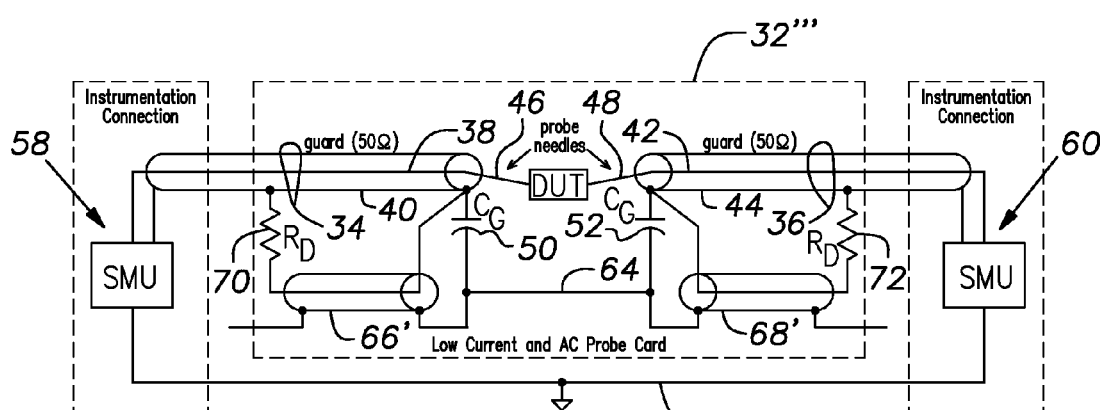
FIG. 11 is a schematic diagram of the DC-AC probe card of FIG. 10 in a DC configuration.

Referring to FIG. 11, the DC-AC probe card 32'''' is shown in a DC measurement configuration similar to FIG. 9.

Figure 12:
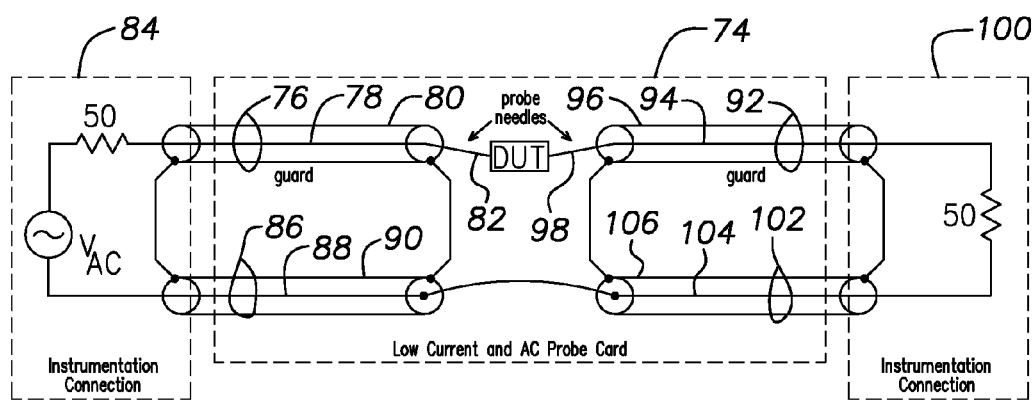
FIG. 12 is a schematic diagram of an example of a DC-AC probe card according to a further aspect of the invention.

Referring to FIG. 12, a DC-AC probe card 74 provides both DC guarding and an AC path that has the desired characteristic impedance.

The probe card 74 has a first transmission line 76 that includes a first conductor 78 and a second conductor 80. The distal end of the first conductor 78 is connected to a first probe needle 82. During operation, the proximal ends of the first and second conductors 78, 80 are connected to the first test instrumentation 84.

A second transmission line 86 includes a third conductor 88 and a fourth conductor 90. The distal end of the fourth conductor 90 is connected to the distal end of the second conductor 80. During operation, the proximal ends of the third and fourth conductors 88, 90 are connected to the first test instrumentation 84. During AC testing, the proximal ends of the second and fourth conductors 80, 90 are connected together as shown.

Similarly, the probe card 74 has a third transmission line 92 that includes a fifth conductor 94 and a sixth conductor 96. The distal end of the fifth conductor 94 is connected to a second probe needle 98. During operation, the proximal ends of the fifth and sixth conductors 94, 96 are connected to the second test instrumentation 100.

A fourth transmission line 102 includes a seventh conductor 104 and a eighth conductor 106. The distal end of the eighth conductor 106 is connected to the distal end of the sixth conductor 96. The distal ends of the third and seventh conductors 88, 104 are connected. During operation, the proximal ends of the seventh and eighth conductors 104, 106 are connected to the second test instrumentation 100. During AC testing, the proximal ends of the sixth and eighth conductors 96, 106 are connected together.

The transmission lines 76, 86 are of equal electrical length, as are the transmission lines 92, 102.

In this example, the AC signals follow the same path independent of frequency, eliminating the resonance issues of the examples above.

Figure 13:
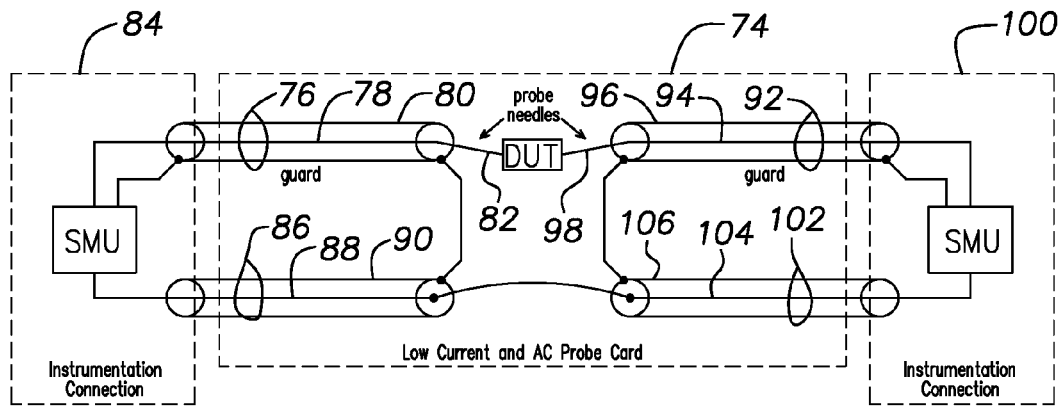
FIG. 13 is a schematic diagram of the DC-AC probe card of FIG. 12 in a DC configuration.
Figure 14:
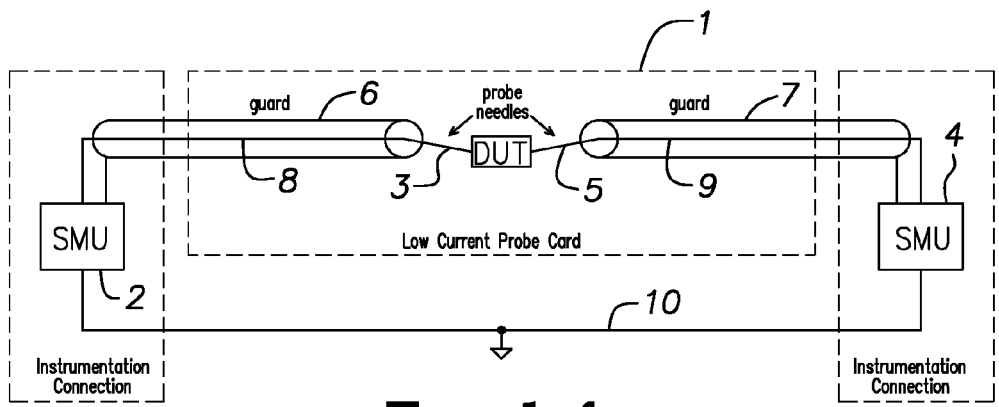
FIG. 14 is a schematic diagram of a prior art example of a probe card for DC testing.
Figure 15:
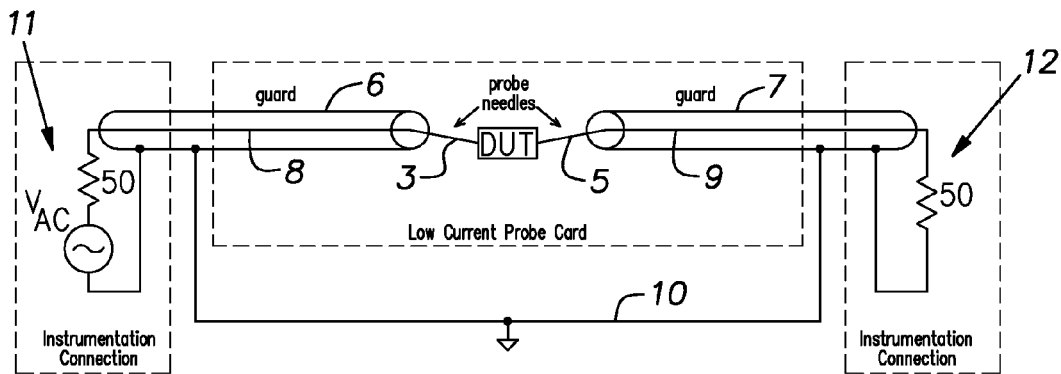
FIG. 15 is a schematic diagram of the prior art probe card of FIG. 8 in an AC testing configuration.

Referring to FIG. 13, the DC-AC probe card 74 is shown instead connected to DC test instrumentation in the test instrumentation 84, 100. The proximal end of the transmission line 76 is connected between the signal and guard of the SMU in the test instrumentation 84 and the proximal end of the transmission line 92 is connected between the signal and the guard of the SMU in the test instrumentation 100. The proximal end of the conductor 88 is connected to the ground of the SMU in the test instrumentation 84 and the proximal end of the conductor 108 is connected to the ground of the SMU in the test instrumentation 84.

The transmission lines 76, 86, 92, 102 are shown as coaxial cables, but other transmission line structures may be used as mentioned above.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A DC-AC probe card having probe needles for testing a DUT, said probe card comprising:
   a first conductor pair including a first conductor and a second conductor, said first and second conductors each having a distal end and a proximal end, said first conductor distal end being connected to a first probe needle and said first and second conductor proximal ends being operable to connect to first test instrumentation;
   a second conductor pair including a third conductor and a fourth conductor, said third and fourth conductors each having a distal end and a proximal end, said third conductor distal end being connected to a second probe needle and said third and fourth conductor proximal ends being operable to connect to second test instrumentation; and
   a coupling circuit, said coupling circuit being operable to couple said second conductor distal end to said fourth conductor distal end for AC test measurements and to decouple said second conductor distal end from said fourth conductor distal end for DC test measurements.

2. A DC-AC probe card according to claim 1, wherein said coupling circuit includes a capacitor that couples AC test signals and decouples DC test signals.

3. A DC-AC probe card according to claim 2, wherein said coupling circuit includes a ground path having an inductance that couples AC test signals and decouples DC test signals.

4. A DC-AC probe card having probe needles for testing a DUT, said probe card comprising:
   a first transmission line including a first conductor and a second conductor, said first and second conductors each having a distal end and a proximal end, said first conductor distal end being connected to a first probe needle and said first and second conductor proximal ends being operable to connect to first test instrumentation;
   a second transmission line including a third conductor and a fourth conductor, said third and fourth conductors each having a distal end and a proximal end, said fourth conductor distal end being connected to said second conductor distal end and said third and fourth conductor proximal ends being operable to connect to said first test instrumentation, wherein said second and fourth conductor proximal ends are connected together during AC measurements;
   a third transmission line including a fifth conductor and a sixth conductor, said fifth and sixth conductors each having a distal end and a proximal end, said fifth conductor distal end being connected to a second probe needle and said fifth and sixth conductor proximal ends being operable to connect to second test instrumentation; and a fourth transmission line including a seventh conductor and an eighth conductor, said seventh and eighth conductors each having a distal end and a proximal end, said eighth conductor distal end being connected to said sixth conductor distal end, said third conductor distal end being connected to said seventh conductor distal end, and said seventh and eighth conductor proximal ends being operable to connect to said second test instrumentation, wherein said sixth and eighth conductor proximal ends are connected together during AC measurements, said first and second transmission lines having equal electrical lengths and said third and fourth transmission lines having equal electrical lengths.

5. A DC-AC probe card according to claim 4, wherein said transmission lines are each coaxial cables with the first conductor, the third conductor, the fifth conductor and the seventh conductor being respective center conductors and the second conductor, the fourth conductor, the sixth conductor and the eighth conductor being respectively coaxial therewith.

* * * * *